US005133015A

United States Patent [19]

Scholz

[11] Patent Number: 5,133,015

[45] Date of Patent: Jul. 21, 1992

[54] METHOD AND APPARATUS FOR PROCESSING AN AUDIO SIGNAL

[76] Inventor: Donald T. Scholz, 40 Lantern La., Weston, Mass. 02193

[21] Appl. No.: 467,928

[22] Filed: Jan. 22, 1990

[51] Int. Cl.[5] .................... H03G 3/00

[52] U.S. Cl. .................... 381/61

[58] Field of Search .................... 381/61, 98, 102; 84/621, 691

[56] References Cited

U.S. PATENT DOCUMENTS

| | | | |
|---|---|---|---|
| 4,405,832 | 9/1983 | Sondermeyer | 381/61 |
| 4,495,640 | 1/1985 | Frey | 381/61 |
| 4,584,700 | 4/1986 | Scholz | 381/61 |
| 4,627,094 | 12/1986 | Scholz | 381/61 |
| 4,683,589 | 7/1987 | Scholz et al. | 381/61 |
| 4,811,401 | 3/1989 | Brown, Sr. et al. | 381/61 |
| 4,995,084 | 2/1991 | Pritchard | 381/61 |

*Primary Examiner*—Forester W. Isen

*Attorney, Agent, or Firm*—Wolf, Greenfield & Sacks

[57] ABSTRACT

An electronic audio signal processor especially suitable for electrical instruments such as electric guitars is provided, including a distortion stage, filtering stages, an output gain stage, and a compressor stage having a varibale release time. These stages are provided in a cascade connection. Further, the characteristics of each of these stages are preset to provide optimum performance at each of several different distortion levels. The correct characteristics of each stage for each distortion level is selected by means of a single user control.

44 Claims, 6 Drawing Sheets

*Fig.3A* (Sheet 1)
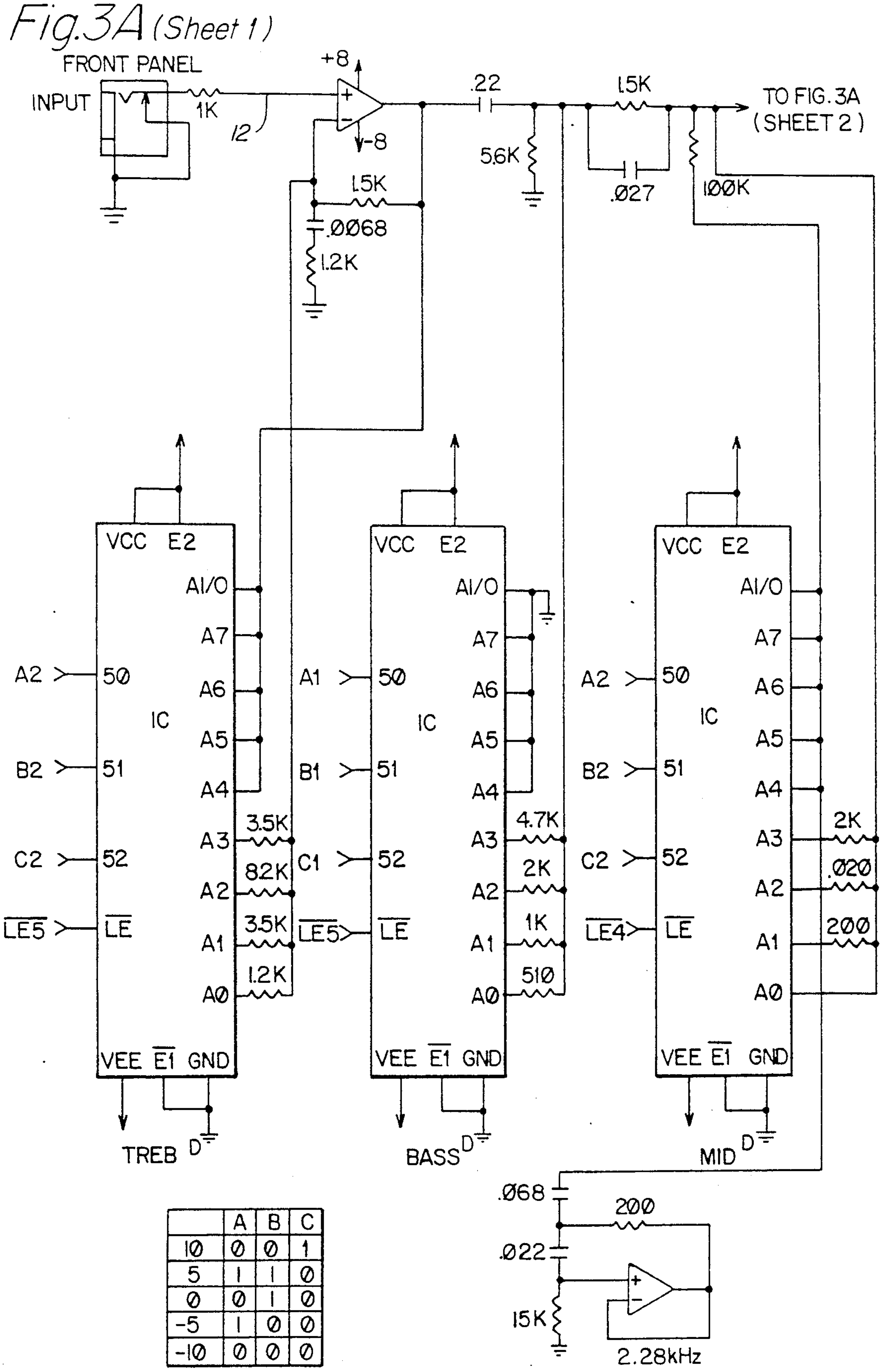
| | A | B | C |
|---|---|---|---|
| 10 | 0 | 0 | 1 |
| 5 | 1 | 1 | 0 |
| 0 | 0 | 1 | 0 |
| -5 | 1 | 0 | 0 |
| -10 | 0 | 0 | 0 |

Fig.3A (Sheet 2)
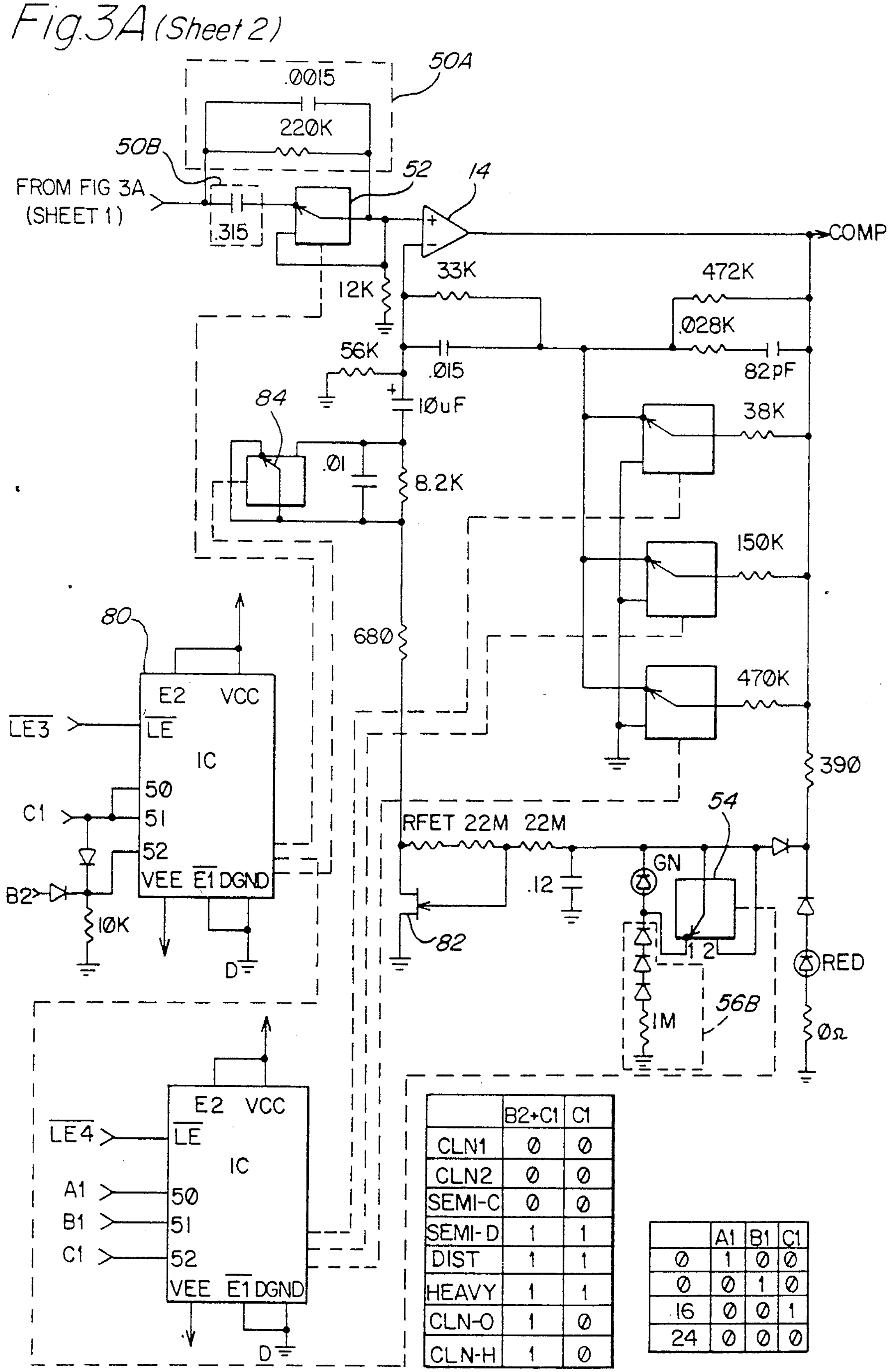
| | B2+C1 | C1 |
|---|---|---|
| CLN1 | 0 | 0 |
| CLN2 | 0 | 0 |
| SEMI-C | 0 | 0 |
| SEMI-D | 1 | 1 |
| DIST | 1 | 1 |
| HEAVY | 1 | 1 |
| CLN-O | 1 | 0 |
| CLN-H | 1 | 0 |
| | A1 | B1 | C1 |
|---|---|---|---|
| 0 | 1 | 0 | 0 |
| 0 | 0 | 1 | 0 |
| 16 | 0 | 0 | 1 |
| 24 | 0 | 0 | 0 |

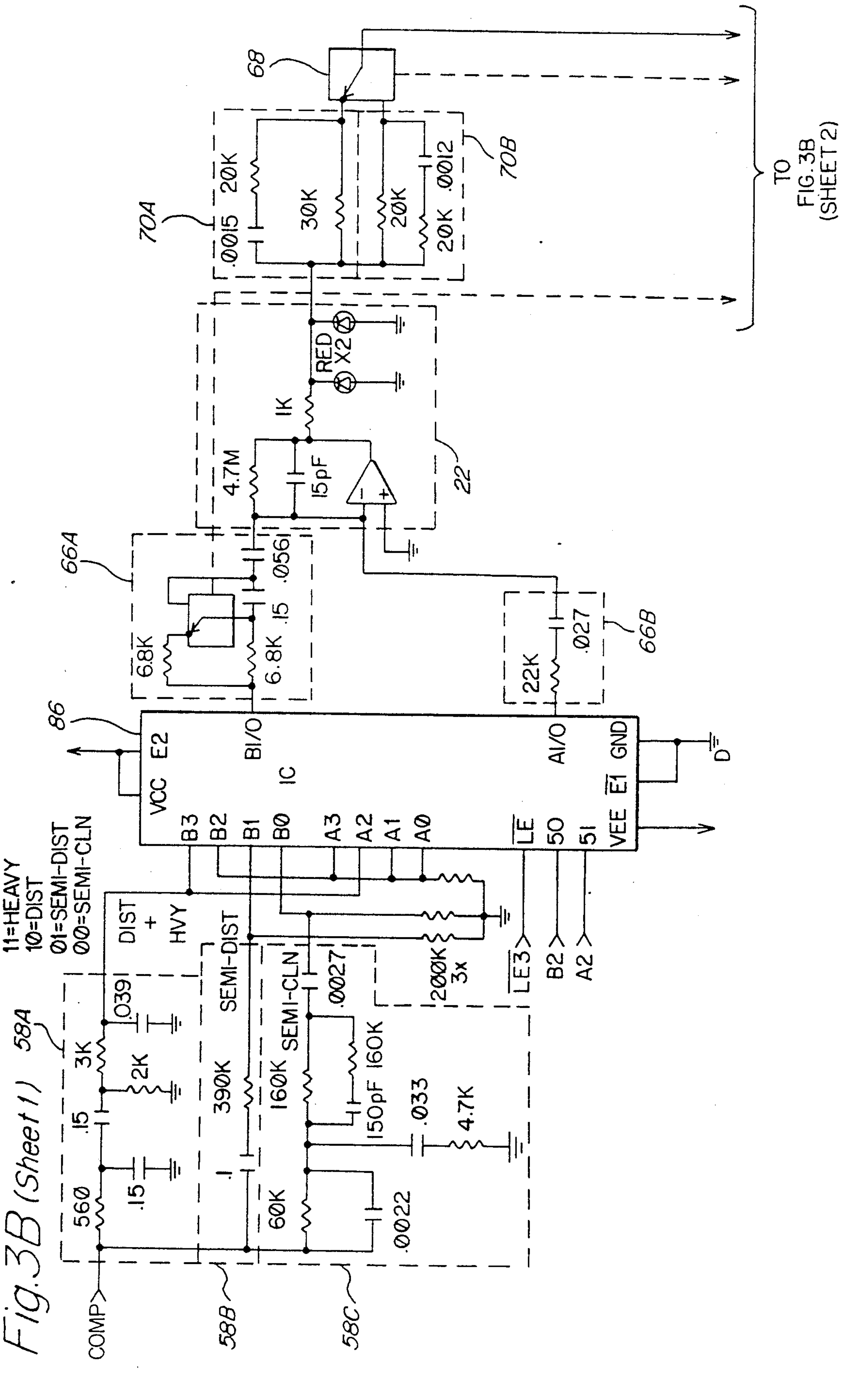
Fig. 3B (Sheet 1)

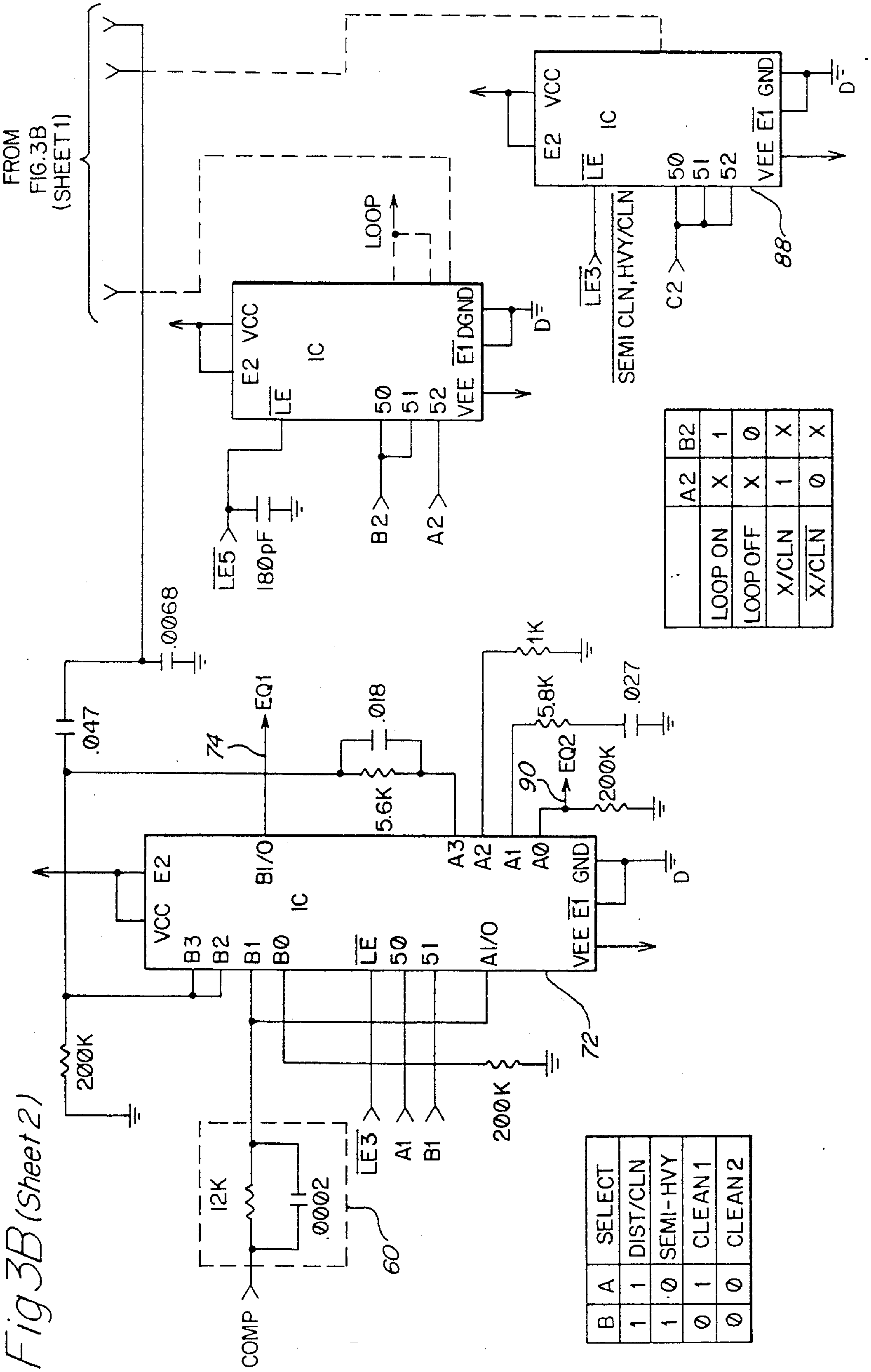
Fig 3B (Sheet 2)
| | A2 | B2 |
|---|---|---|
| LOOP ON | X | 1 |
| LOOP OFF | X | 0 |
| X/CLN | 1 | X |
| $\overline{X/CLN}$ | 0 | X |
| B | A | SELECT |
|---|---|---|
| 1 | 1 | DIST/CLN |
| 1 | 0 | SEMI-HVY |
| 0 | 1 | CLEAN1 |
| 0 | 0 | CLEAN2 |

METHOD AND APPARATUS FOR PROCESSING AN AUDIO SIGNAL

BACKGROUND OF THE INVENTION

1. Field of the Invention

This invention relates to a method and apparatus for processing an audio signal and more particularly to a technique for permitting varying degrees of distortion to the audio output for a guitar or other musical instrument without causing any substantial change in the volume of the output signal and in the treble and bass content of this signal.

In playing various types of electronic musical instruments, such as for example electric guitars, a desirable acoustic effect can be achieved for some types of music by the controlled distortion of the instrument output. An undistorted signal is generally referred to as a "clean signal". Distortion is may be achieved by increasing the gain of the signal as the signal is applied to a distortion amplifier, overdriving the amplifier so that a portion of the wave-form is clipped, or by clipping in other ways, some of which may result in a reduced volume output with increasing distortion. Depending on the desired musical effect, distortion may vary from very little clipping or distortion to heavy distortion where most of the wave form is clipped.

While distortion devices have been on the market for many years, existing devices of this type have a number of limitations. First, because of the manner in which distortion is achieved through use of either a distortion amplifier or other forms of clipping, as distortion on a signal is increased, the output volume of the signal is variably increased. This variation in volume is generally undesirable and is particularly undesirable when the instrument is being played as part of a band or as a backup for a singer where it can adversely affect the balance of the group. In the past, a musician might compensate for this volume change by manually adjusting the output volume when he changed the degree of distortion. However, having to adjust two controls during a live or studio performance is difficult and it is even more difficult under these circumstances to achieve anything resembling a uniform output volume level. While devices exist which permit a particular preset volume level for a particular distortion setting, and U.S. Pat. No. 4,752,962, entitled "Audio Processing Circuit" issued Jun. 21, 1988, teaches a circuit which detects output volume and uses the detected output volume to perform compensations, there is no system currently on the market which automatically compensates for volume changes solely as a function of a selected distortion level over the full distortion range of the distortion device. Operating solely in response to the selected distortion is simpler and less expensive than the circuit shown in the patent and may eliminate noise and distortion caused by spurious volume changes or to rapid response thereto.

Another problem with distortion devices is that the distortion tends to alter the harmonic content of the output signal, and in particular to make the signal brassier or more treble. There may also be some increase in the perceived bass content as distortion increases. Such changes in harmonic content and spectral density may also adversely affect balance in a band setting and are thus also undesirable; and such variations are also very difficult to compensate for during a live performance. Again, while a preset may be possible for a single distortion setting, and U.S. Pat. No. 4,752,960 teaches some tone compensation based on a detected volume level, no technique or apparatus is currently available which automatically compensates for such spectral and harmonic variations over the full range of the distortion device solely as a function of the selected distortion level.

Finally, it is common to use a compressor circuit at the input to the distortion device. A compressor is basically an amplifier, the gain of which varies as a function of the amplitude of the signal applied thereto. Since rapid changes in this gain can cause distortion of a clean audio output, the release time, which is the time required for a change in gain to occur as a result of an increase in audio input volume level, it is generally relatively long for such compressors. Typically, the release time is in the range of one half to one second for a olean signal. However, the distortion caused by a shorter release time is not a problem for a signal which is undergoing relatively heavy distortion, and it is desirable that the release time of the input compressor be reduced when the distortion device is operating with a relatively high degree of distortion. Existing distortion devices do not alter the release time of the input compressor based on the degree of distortion. In most systems it would be difficult for the musician to achieve this desirable affect.

It is therefore desirable that an improved method and apparatus be provided for distorting an audio signal such as that generated by an electronic musical instrument which permits such distortion to be achieved without any substantial change in the volume, base content or treble content of the audio output and in particular that these capabilities be automatically achievable in response only to the musician selecting a desired level of distortion.

SUMMARY OF THE INVENTION

In accordance with the above, this invention provides a method and apparatus for processing an audio signal which includes distorting the audio signal by a controlled degree. The distortion causes variations in the volume of the output as the degree of distortion increases and also causes increases in the bass and treble content of the output with increasing distortion. The volume variation is compensated for by automatically maintaining the volume of the audio signal outputted from the distortion element substantially uniform regardless of the degree of distortion, the compensation occuring solely as a function of the selected degree of distortion. Where compression is provided prior to distortion, a capability is provided for adjusting the compressor release time so that the release time is less for higher degrees of distortion. Adjustable filtering may also be applied at the input to the distortion element, the filtering being adjustable in response to the selected degree of distortion to at least partially compensate for spectral and harmonic variations caused by the distortion. Preferably, the filtering causes decreasing emphasis on treble frequencies and bass frequencies as the degree of distortion increases. The output from the distortion element may also be adjustably filtered for evening out spectral density and harmonic content. Preferably, the output filtering increasingly rolls off at the high frequency end and at the low frequency end as the degree of distortion increases. For the preferred embodiment, output gain control, input and output filtering, and adjustment on compressor release time are all provided.

The foregoing and other objects, features and advantages of the invention will be apparent from the following more particular description of a preferred embodiment of the invention as illustrated in the accompanying drawings.

IN THE DRAWINGS

Figure 2:
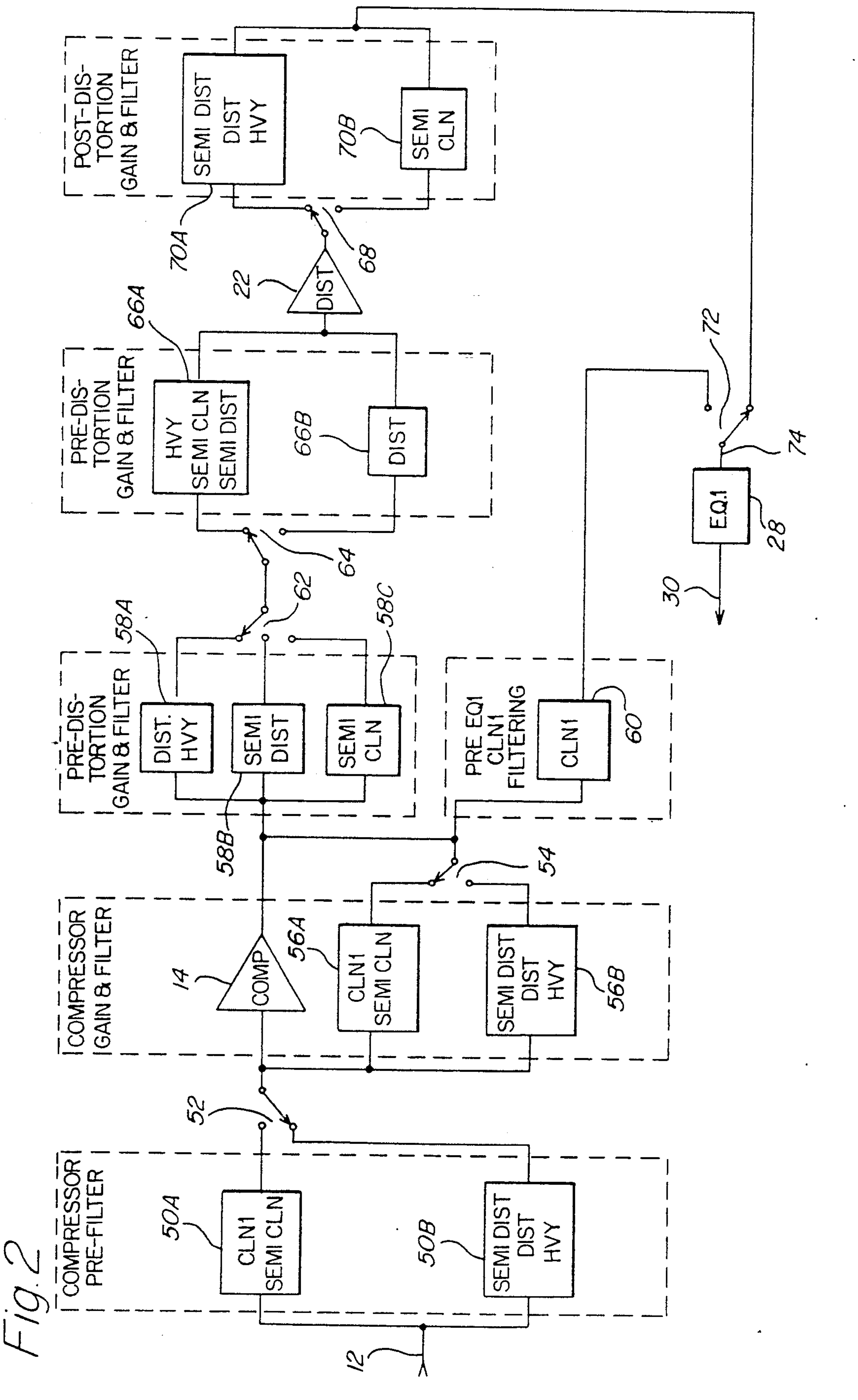
FIG. 2 is a block diagram of a circuit implementing the teachings of this invention.

FIGS. 3A and 3B, when combined, form a more detail circuit diagram in semi block form of the embodiment of the invention shown in FIG. 2.

DETAILED DESCRIPTION

Figure 1:
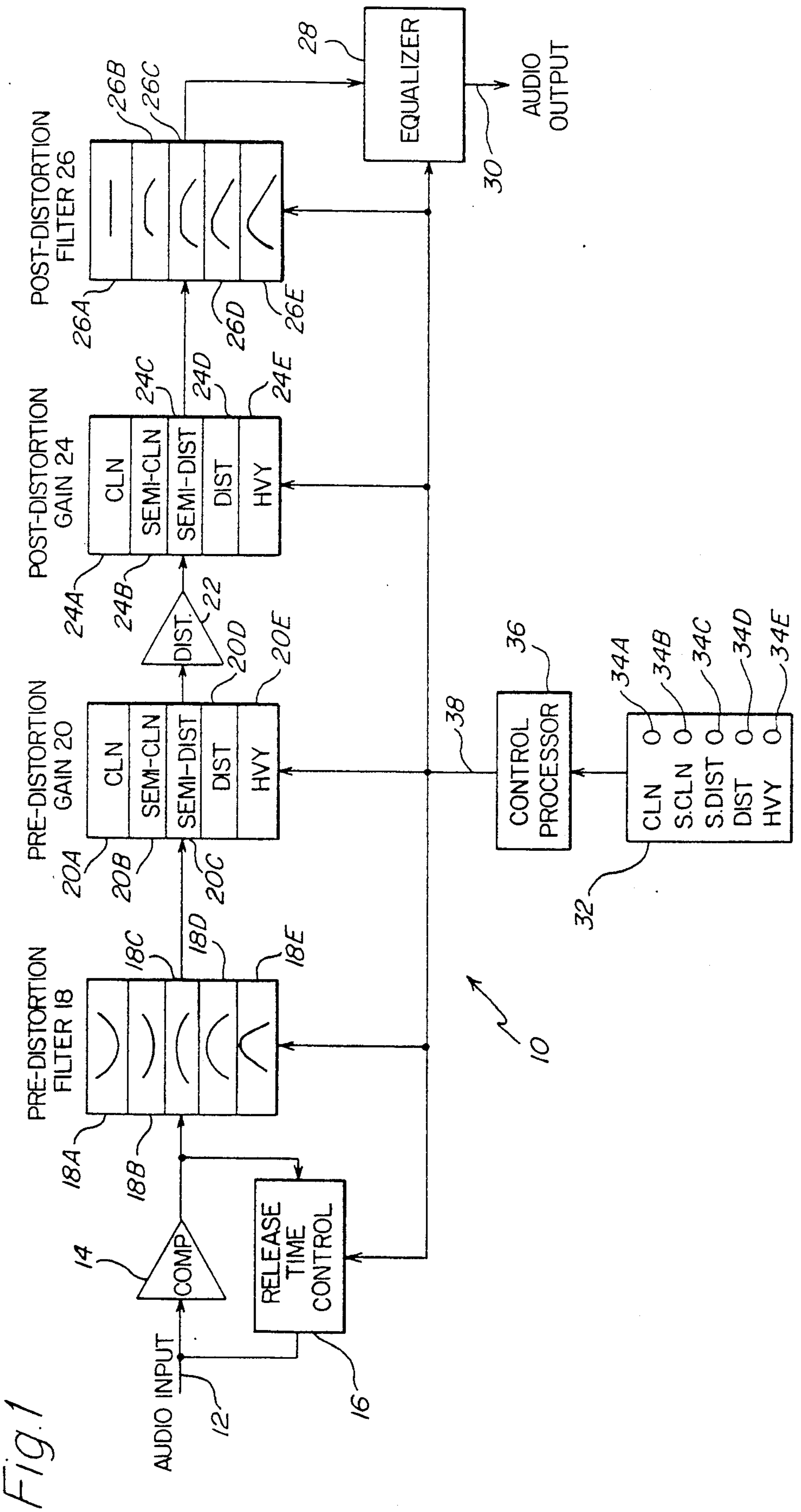
FIG. 1 is a block diagram of an idealized circuit incorporating the teachings of this invention.

Referring to FIG. 1, a block diagram is shown of an idealized circuit 10 incorporating the teachings of this invention. In this circuit, an audio input signal is received on line 12 from an audio source which would typically be an electronic musical instrument such as an electric guitar. The audio input is passed through a compression circuit 14 which has a controlled gain which varies as a function of the input amplitude. The release time for compressor 14, which is the time required for increasing gain transitions, is controlled by a release time control circuit 16. Compressor 14 may for example be the compression circuit shown in the before mentioned patent or other suitable circuits for performing this function.

The output from compressor 14 is applied as a signal input to a pre-distortion filter 18. Filter 18 is preferably formed of a number of separate filter sections 18A–18E connected in parallel. Each filter has a particular filter characteristic which is appropriate for a particular degree of distortion, with only one of the filters 18 being connected in the circuit at any given time. Exemplary filter characteristics as a function of frequency are shown in FIG. 1 for each of the filters 18, with filter 18A being for a "clean" setting and filter 18E being for the maximum or "Heavy" distortion setting. From FIG. 1, it is seen that as the level of distortion increases, there is less and less emphasis at the treble and base ends of the spectrum, with maximum roll off at the treble and base ends occuring in filter 18E for heavy distortion.

While in the discussion of filter 18, and in the discussion to follow, five discrete distortion levels are assumed which, for purposes of illustration, are labeled as clean (i.e. no distortion), semi-clean, semi distorted, distorted, and heavy (i.e. heavy distortion), these five settings are for purpose of illustration only. It is to be understood that the invention may be practiced with a greater or lesser number of discrete distortion settings, and that it is also possible that the degree of distortion may be continuously variable, while still practising the teachings of the invention. Further, while exemplary filter characteristics have been illustrated for the filters 18A–18E, it is to be understood that these characteristics are by way of illustration only and that the exact characteristics will depend on a number of factors including the distortion circuit utilized, and any preprocessing on the audio input prior to being applied to the filter 18. Finally, while a single filter 18 is shown in FIG. 1, the audio input may, in fact, be passed through a series of filters to achieve the desired filter characteristic,, and some of the filters may be located prior to compressor circuit 14 or after pre-distortion gain circuit 20.

The output from the filter 18 utilized is applied as the audio signal input to pre-distortion gain circuit 20. Again, gain circuit 20 may be formed of a plurality of separate gain circuits 20A–20E connected in parallel with the appropriate one of the gain circuits 20 being switched into operation based on the selected distortion. The gain circuit may also be located before the filter. Some gain change may also be made before the compressor which will affect the amplitude of lower level signal more than the amplitude of higher level signal at the input of the distortion circuit.

The audio output from the selected gain circuit 20 is applied as the audio input to distortion circuit 22. Where the distortion circuit is a distortion amplifier, depending on the gain applied to the audio signal by circuit 20, distortion circuit 22 is overdriven by a predetermined amount resulting in the desired degree of distortion.

The output from distortion circuit 22 is connected as the audio input to post-distortion gain circuit 24.

Post-distortion gain circuit 24 is operative to compensate for the gain in the audio signal caused by circuits 20 and 22 so that the perceived audio output from circuit 10 for a typical musical instrument input signal remains substantially uniform regardless of the distortion setting. Circuit 24 may also be formed of five separate gain circuits 24A–24E connected in parallel, with only one of the circuits 24 being switched in depending on the distortion setting. If the gain introduced by circuits 20 and 22 increases as the distortion increases, circuits 24 provide decreasing gain as the degree of distortion increases. Thus, circuit 24A may provide no attenuation, while circuit 24E provides the greatest attenuation. However, because of losses in distortion amplifier 22, the amount of attenuation required in circuit 24 for a given distortion setting is substantially less than the degree of gain required from circuit 20 to achieve the desired level of distortion. Alternatively, circuit 24 may be a post amplifier which provides greater amplification as the degree of selected distortion decreases. If a distortion circuit is utilized which results in reduced volume with increasing distortion circuits 24 might provide increasing gain for increased distortion. The objective is that circuits 24 provide appropriate compensation to maintain a substantially uniform preceived output volume.

The output from the selected circuit 24 is applied as the audio input to post distortion filter circuit 26. Again, for purposes of illustration, the circuit 26 is shown as five separate filter circuits 26A–26E which are connected in parallel, with only one of the filter circuits being switched into the circuit for any selected distortion level. As for the other circuits, circuit 26A is a filter utilized with a "clean" setting while filter 26E is for heavy distortion. Exemplary filter characteristics ar shown for each of the filter segments, with the filter characteristic for "clean" filter 26A being substantially flat, and with the base and treble roll-offs on the filters becoming increasingly great, particularly the treble roll off, as the degree of distortion increases. The filter is thus designed to compensate for the increases in bass and treble harmonic content in the audio signal caused by distortion circuit 22. Again, as previously indicated, the exact filter characteristic for each distortion setting will vary depending on a number of factors including the particular distortion circuit being utilized and the characteristics shown in FIG. 1 are thus for purposes of illustration only. However, for typical distortion circuits 22 the bass and treble characteristics of the filter will exhibit increasing roll-off as the distortion level increases.

The output from the selected one of filters 26 is connected as the audio input to an equalizer 28. Equalizer 28 may be of the type described in the aforementioned U.S. patent or other suitable equalizer circuit, the function of this circuit not forming part of the present invention. The output from equalizer 28 on line 30 is the audio output from circuit 10.

An input device 32 is provided which may be a control panel with push buttons 34 (as shown), a foot switch which may be stepped to the desired distortion level, a dial which may be set to the desired distortion level, or other suitable control. The output from device 32, which output may be either analog or digital, is applied as a control input to processor 36. Processor 36 may, for example, be a standard microprocessor which is programmed to control the operation of the circuit of this invention, or it may be a special purpose control circuit designed for this function. Control processor 36 recognizes the distortion level selected by the musician o the user on control device 32 and generates suitable outputs on lines 38 to control switch settings for release time control 16, pre-distortion filter 18, pre-distortion filter gain 20, post distortion gain 24, post-distortion filter 26, and equalizer 28. Typically, each of the control devices would include an electronic switch which operates in response to a digital input from the processor to switch the appropriate element into the circuit depending on the distortion level selected at device 32. Thus, if the "dist" button 34D is operated, processor 36 would generate outputs on lines 18 causing release time control 16 to operate in a reduced release time mode, and to switch pre-distortion filter 18D, pre-distortion gain circuit 20D, post-distortion circuit 24D and post-distortion circuit 26D into the circuit. With the circuit, the volume and harmonic content of audio output 30 would be perceived by a listener to be substantially uniform for a typical instrumentation over the full range of distortion settings.

While in FIG. 1, separate elements have been shown for filtering and gain control, as will be seen in the discussion to follow, these functions may in some cases be performed by common elements. Also, in some applications, commercially acceptable results may be achieved by utilizing the same gain control and/or filter for several distortion levels or settings rather than requiring a separate circuit for each setting. Thus, while FIG. 1 shows a conceptual implementation of the circuit of this invention in somewhat idealized form, FIG. 2 illustrates at a practical implementation of the circuit. The same numbers have been used for common elements in the two circuits.

Referring to FIG. 2, it is seen that the audio input on line 12 is initially applied in parallel to a pair of compressor pre filters 50A and 50B. To reduce cost, only two filters 50 are utilized in this in circuit with filter 50A being utilized if a clean or semi-clean distortion setting is selected and filter 50B being utilized if a semi-distorted, distorted or heavy distortion setting is selected. The characteristics of the filters 50A and 50B ar selected such that, in conjunction with the other pre-distortion filtering circuits in the circuit of FIG. 2, the filter characteristics for the various distortion settings are substantially as shown for the pre-distortion filter 18 in FIG. 1.

The outputs from filters 50A and 50B are applied as inputs to an electronic switch 52 which is set to one or the other of its settings in response to a suitable control signal from central processor 36 (FIG. 1). The output from switch 52 is applied to compressor circuit 14.

The output from compressor circuit 14 is fed back through an electronic switch 54 to either a circuit 56A or a circuit 56B, which circuits perform, among other things, the release time control function. Switch 54 is set to direct the feedback signal to circuit 56A if a clean or semi-clean distortion setting is selected and to direct the feedback signal to circuit 56B if a semi distorted, distorted, or heavy distortion setting is selected. The outputs from circuits 56A and 56B are fed back to an input of compressor 14.

The output from compressor 14 is also applied to pre-distortion filter gain circuits 58A, 58B and 58C and to pre-equalizer filter circuit 60. Circuit 58A is utilized if the distortion setting is either distortion or heavy, circuit 58B is utilized for a semi-distortion setting and circuit 58C is used for a semi-clean distortion setting. The characteristics of the filters portion of circuits 58 and filter 60 are selected such that, in conjunction with the characteristics of filters 50, and any other pre-distortion filters in the system, the combined pre-distortion characteristic for the filters through which an audio signal passes for a given distortion setting are substantially as shown for the pre-distortion filters 18 in FIG. 1.

The outputs from circuits 58 are applied as the inputs to an electronic switch 62 which is set to the appropriate one of the circuit outputs under control of processor 36 in response to the selected distortion setting. The output from switch 62 is applied as an input to electronic switch 64, the outputs from which are applied as the inputs to pre-distortion gain and filter circuits 66A and 66B. Processor 36 causes switch 64 to be set to circuit 66A if the distortion setting is semi-clean, semi-distorted, or heavy and to circuit 66B if the distortion setting is "distorted." The circuits 66 in conjunction with the circuits 58 provide the gain control required to achieve the desired distortion level and also perform additional pre-distortion filtering to assist in achieving the desired pre-distortion filter characteristics shown for the filters 18 in FIG. 1.

The outputs from the selected circuit 66 are applied as the audio inputs to distortion circuit 22. The outputs from distortion circuit 22 are applied to an electronic switch 68 controlled from processor 36. Switch 68 applies the distortion output to either post distortion gain and filter circuit 70A or 70B. Switch 68 is set to circuit 70A if a semi distorted, distorted, or heavy distorted setting is selected and to circuit 70B if a semi-clean distortion level is selected. Circuits 70 perform the functions of the post distortion gain circuit 24 and post distortion filter circuit 26 shown in FIG. 1 to compensate for the increased gain resulting from the distortion operation and to perform treble and base filtering to compensate for increases in harmonic content in these ranges as a result of the distortion operation. Circuit 70A can perform the desired function for the three distortion levels only if there is little difference in the volume and harmonic input to the circuit for these settings. It is preferable that additional circuits 70 be provided.

The outputs from circuit 70 are applied as one input to electronic switch 72, the other input to this switch being the output from filter 60. Switch 72 is set to the output from filter 60 if a "clean" setting has been selected and is otherwise set to receive the outputs from a circuit 70. The output from switch 72 is applied through equalizer circuit 28 to audio output line 30.

FIGS. 3A and 3B are more detailed diagrams of the circuit shown in FIG. 2. To the extent possible, common reference numerals have been utilized in the various figures. It will, however, be noted that some minor differences in detail exist between the general circuit diagram of FIG. 2 and the more detailed circuit diagram of FIGS. 3A and 3B. Further, the circuit diagrams of FIGS. 3A and 3B contain a number of elements which perform various functions not directly related to the current invention. These elements will not be mentioned in the discussion to follow which is limited to a discussion of the elements utilized in performing the functions of this invention.

Referring first to FIG. 3A, it is seen that the input signal 12 is passed through a number of components which are involved in performing an equalization function which is not part of the present invention to the compressor pre filters 50A and 50B. Switch 52, which is part of an electronically controlled switch chip 80, passes the output from the appropriate one of the filters 50 to one input of compressor amplifier 14. The feedback circuit for the compressor amplifier includes several parallel paths to ground, one of which is reached through switch 54. When switch 54 is in position 1, the path 56B is added into the circuit resulting in a reduction in the release time for the compressor circuit. The compressor circuit is controlled by an FET 82, the output from which is applied through varies components as a control input to amplifier 14. Switch 84, which is also part of the switch circuit 80, is in the position shown for the distortion or heavy distortion settings, and is transferred to a short circuit mode to short out the resistor and capacitor in other distortion modes to reduce noise in the circuit at low signal level.

The output from the compressor 14 is applied at two points in the circuit of FIG. 3B, namely as an input to circuits 58A 58B and 58C, and is an input to filter 60. The circuits 58 perform the functions previously indicated and the outputs from these circuits are applied to a switch circuit 86 which performs the functions of the switches 62 and 64 in FIG. 2. Switch circuit 86 applies outputs to pre-distortion gain and filter circuits 66A and 66B which are the inputs to the distortion circuit 22. The distortion circuit 22 functions in well known manner to perform controlled clipping on the input signal applied thereto depending on the gain level of its input signal.

The output from distortion circuit 22 is applied to post distortion gain and filter circuits 70A and 70B, with the outputs from these circuits being applied as the inputs to switch 68. Switch 68 is part of a switch circuit 88 controlled from processor 36.

The output from switch 68 is applied as one of the inputs to switch circuit 72, a second input to this switch circuit being the output from filter circuit 60. Line 74 leading to equalizer 28 is one of the outputs from switch 72. A second output from this switch is line 90 leading to a second equalizer circuit.

While specific components are shown in FIG. s 3A and 3B for performing the various functions, it is to be understood that these components and values, while utilized for a preferred embodiment of the invention, are for purposes of illustration only, and that these components and values might be different for an input having different characteristics, for a different distortion circuit, for a different desired output, or for other variations which might come within the contemplation of this invention.

While for the preferred embodiment, the "clean" output from filter 60 has bypassed the gain and filter circuits 66, distortion circuit 22 and post distortion gain and filter circuits 70, as illustrated by FIG. 1, this is not a limitation on the invention. However, the "clean" setting is the only one which can bypass these elements. Further, while three specific functions have been automatically compensated for in connection with a distortion circuit, it is apparent that other variations resulting from the use of a distortion circuit might also be automatically compensated should a user so desire. Thus, while the invention has been particularly shown and described above with reference to a generalized and a preferred embodiment, the foregoing and other changes in form in detail may be made therein by one skilled in the art without departing from the spirit and scope of the invention.

What is claimed is:

1. A circuit for processing an audio signal comprising:

means for distorting said audio signal;

means for indicating a desired degree of distortion having a single user input element;

means responsive to said indicating means for controlling the degree of distortion caused by said distortion means, said distortion means having an output volume which varies in a predetermined way as the degree of distortion increases; and output means responsive to said indicating means for automatically, and without further user input, maintaining the volume of the audio signal output from said circuit substantially at a desired level regardless of the degree of distortion caused by said distortion means.

2. A circuit as claimed in claim 1 wherein said distortion means has a predetermined number of distortion states, each providing a different degree of distortion; and wherein said output means comprises a predetermined number of fixed gain elements, each one of said gain elements corresponding to one of said distortion states, and having a gain value which causes the overall gain of the distortion means and output means, combined, to remain substantially constant for each of said states.

3. A circuit as claimed in claim 2 wherein said distortion means includes a distortion amplifier; and wherein said means for controlling includes means responsive to said indicating means for controlling the gain of the audio signal inputted to said distortion means.

4. A circuit as claimed in claim 1 including compressor means through which said audio signal is passed before being applied to said distortion means, said compressor means having a release time; and means responsive to said indicating means for adjusting said compressor means release time, the release time being less for higher degrees of distortion.

5. A circuit as claimed in claim 1 including adjustable filter means through which said audio signal is passed before being applied to said distortion means, said filter means being adjusted in response to said indicating means to at least partially compensate for spectral and harmonic variations caused by said distortion means which vary with changes in the degree of distortion.

6. A circuit as claimed in claim 5 wherein said filter means has decreasing emphasis at high frequencies and low frequencies as the degree of distortion increases.

7. A circuit as claimed in claim 1 wherein said output means includes adjustable output filter means responsive to said indicating means for evening out spectral density and harmonic content of said outputted audio signal.

8. A circuit as claimed in claim 7 wherein said output filter means increasingly rolls off at the high frequency end and at the low frequency end as the degree of distortion of said distortion means is increased.

9. A circuit as claimed in claim 7 including compressor means through which said audio signal is passed before being applied to said distortion means, said compressor means having a release time; and means responsive to said indicating means for adjusting said compressor means release time, the release time being less for higher degrees of distortion.

10. A circuit as claimed in claim 1 wherein said output means includes adjustable output filter means responsive to said indicating means for evening out spectral density and harmonic content of said outputted audio signal.

11. A circuit as claimed in claim 10 wherein said output filter means increasingly rolls off at the high frequency end and at the low frequency end as the degree of distortion of said distortion means is increased.

12. A circuit for processing an audio signal comprising:

means for distorting said audio signal;

means for indicating a desired degree of distortion;

means responsive to said indicating means for controlling the degree of distortion caused by said distortion means, said distortion means causing spectral and harmonic variations in said audio signal which vary with changes in the degree of distortion;

output means responsive to said indicating means for automatically, and without further user input, maintaining the volume of the audio signal output from said circuit substantially at a desired level regardless of the degree of distortion caused by said distortion means; and adjustable filter means through which said audio signal is passed before being applied in said distortion means, said filter means being adjusted in response to said indicating means to at least partially compensate for said spectral and harmonic variations.

13. A circuit as claimed in claim 12 wherein said filter means has decreasing emphasis at high frequencies and low frequencies as the degree of distortion increases.

14. A circuit as claimed in claim 12 including adjustable output filter means at the output from said distortion means, said output means being adjusted in response to said indicating means to even out spectral density and harmonic content of said outputted audio signal.

15. A circuit as claimed in claim 14 wherein said output filter means increasingly rolls off at the high frequency end and at the low frequency end as the degree of distortion of said distortion means is increased.

16. A circuit for processing an audio signal comprising:

means for distorting said audio signal;

means for indicating a desired degree of distortion;

means responsive to said indicating means for controlling the degree of distortion caused by said distortion means, said distortion means causing spectral and harmonic variations in said audio signal which vary with changes in the degree of distortion;

output means responsive to said indicating means for automatically, and without further user input, maintaining the volume of the audio signal output from said circuit substantially at a desired level regardless of the degree of distortion caused by said distortion means; and output filter means at the output from said distortion means, said output filter means being adjustable in response to said indicating means to even out the spectral density and harmonic content of said outputted audio signal.

17. A circuit as claimed in claim 16 wherein said output filter means increasingly rolls off at the high frequency end and at the low frequency end as the degree of distortion of said distortion means is increased.

18. A circuit for processing an audio signal comprising:

means for distorting said audio signal;

means for indicating a desired degree of distortion;

means responsive to said indicating means for controlling the degree of distortion caused by said distortion means;

compressor means through which said audio signal is passed before being applied to said distortion means, said compressor means having a release time; and means responsive to said indicating means for adjusting said compressor means release time, the release time being less for higher degrees of distortion.

19. A method for processing an audio signal comprising the steps of:

providing a predetermined degree of distortion to said audio signal, said distortion step varying the volume of said audio signal in a predetermined way as the degree of distortion increases; and automatically maintaining the volume of the audio signal outputted from said distortion step substantially at a desired level regardless of the degree of distortion during said distortion step, said maintaining step being performed in response to a selected distortion level input from a user.

20. A method as claimed in claim 19 including the step performed before said distortion step of compressing said audio signal, and adjusting the release time of the audio signal during said compression step so that said release time is less for higher degrees of distortion.

21. A method as claimed in claim 19 including the step performed before said distorting step of adjustably filtering said audio signal to at least partially compensate for spectral and harmonic variations caused by the distortion step which variations vary with changes in the degree of distortion, said adjustable filtering being performed in response to said selected distortion level input.

22. A method as claimed in claim 21 wherein said filtering step includes the step of decreasing emphasis on high frequencies and low frequencies as the degree of distortion increases.

23. A method as claimed in claim 22 including the step of adjustably filtering the output from said distortion step to even out spectral density and harmonic content of said outputted audio signal, said output filtering step being performed in response to said selected distortion level input.

24. A method as claimed in claim 23 wherein said output filtering step includes the step of increasingly rolling off at the high frequency and at the low frequency end as the degree of distortion of said distortion means is increased.

25. A method as claimed in claim 23 including the step performed before said distortion step of compressing said audio signal, and adjusting the release time of the audio signal during said compression step so that said release time is less for higher degrees of distortion.

26. A method as claimed in claim 19 including the step of adjustably filtering the output from said distortion step to even out spectral density and harmonic content of said outputted audio signal, said output filtering step being performed in response to said selected distortion level input.

27. A method as claimed in claim 26 wherein said output filtering step includes the step of increasingly rolling off at the high frequency end at the low frequency end as the degree of distortion of said distortion means is increased.

28. A method for processing an audio signal comprising the steps of:

providing a predetermined degree of distortion to said audio signal in response to a selected distortion level input from a user, said distortion step causing spectral and harmonic variations in said audio signal which vary with changes in the degree of distortion;

adjustably filtering the audio signal inputted to said distortion step in response to said selected distortion level input to at least partially compensate for said spectral and harmonic variations; and automatically maintaining the volume of the audio signal output from said distortion step substantially at a desired level regardless of the degree of distortion during said distortion step, said maintaining step being performed in response to a selected distortion level input from a user.

29. A method as claimed in claim 28 wherein said filtering step includes the step of decreasing emphasis on high frequencies and low frequencies as the degree of distortion increases.

30. A method as claimed in claim 28 including the step of adjustably filtering the output from said distortion step in response to said selected distortion level input to even out the spectral density and harmonic content of said outputted audio signal.

31. A method as claimed in claim 30 wherein said output filtering step includes the step of increasingly rolling off at the high frequency and at the low frequency end as the degree of distortion of said distortion means is increased.

32. A method of processing an audio signal comprising the steps of:

providing a predetermined degree of distortion to said audio signal in response to a selected distortion level input from a user, said distortion step causing spectral and harmonic variations in said audio signal which vary with changes in the degree of distortion;

adjustably filtering the output from said distortion step in response to said selected distortion level input to even out spectral density and harmonic content of said outputted audio signal; and automatically maintaining the volume of the audio signal output from said distortion step substantially at a desired level regardless of the degree of distortion during said distortion step, said maintaining step being performed in response to a selected distortion level input from a user.

33. A method as claimed in claim 32 wherein said output filtering step includes the step of increasingly rolling off at the high frequency and at the low frequency end as the degree of distortion of said distortion means is increased.

34. A circuit for processing an audio signal comprising:

means for distorting said audio signal;

means for indicating a desired degree of distortion;

means responsive to said indicating means for controlling the degree of distortion caused by said distortion means, said distortion means having an output volume which varies in a predetermined way as the degree of distortion increases;

output means responsive to said indicating means maintaining the volume of the audio signal output from said circuit substantially at a desired level regardless of the degree of distortion caused by said distortion means;

compressor means through which said audio signal is passed before being applied to said distortion means, said compressor means having a release time; and means responsive to said indicating means for adjusting said compressor means release time, the release time being less for higher degrees of distortion.

35. A circuit for processing an audio signal comprising:

means for distorting said audio signal;

means for indicating a desired degree of distortion;

means responsive to said indicating means for controlling the degree of distortion caused by said distortion means, said distortion means having an output volume which varies in a predetermined way as the degree of distortion increases;

output means responsive to said indicating means maintaining the volume of the audio signal output from said circuit substantially at a desired level regardless of the degree of distortion caused by said distortion means;

said output means further including adjustable filter means responsive to said indicating means for evening out spectral density and harmonic content of said outputted audio signal;

compressor means through which said audio signal is passed before being applied to said distortion means, said compressor means having a release time; and means responsive to said indicating means for adjusting said compressor means release time, the release time being less for higher degrees of distortion.

36. A method for processing an audio signal comprising the steps of:

compressing said audio signal, and adjusting the release time of the audio signal during said compression step so that said release time is less for higher degrees of distortion;

providing a predetermined degree of distortion to said audio signal, said distortion step varying the volume of said audio signal in a predetermined way as the degree of distortion increases; and automatically maintaining the volume of the audio signal output from said distortion step substantially at a desired level regardless of the degree of distortion during said distortion step, said maintaining step being performed in response to a selected distortion level input from a user.

37. A method for processing an audio signal comprising the steps of:

adjustably filtering audio signal before said distorting step to at least partially compensate for spectral and harmonic variations caused by the distortion step which variations vary with changes in the degree of distortion, said adjustable filtering being performed in response to said selected distortion level input;

said filtering step further including the step of decreasing emphasis on high frequencies and low frequencies as the degree of distortion increases;

compressing said audio signal, and adjusting the release time of the audio signal during said compression step so that said release time is less for higher degrees of distortion;

providing a predetermined degree of distortion to said audio signal, said distortion steps varying the volume of said audio signal in a predetermined way as the degree of distortion increases;

adjustably filtering the audio signal inputted to said distortion step to even out spectral density and harmonic content of said outputted audio signal, said output filtering step being performed in response to said selected distortion level input;

automatically maintaining the volume of the audio signal output from said distortion step substantially at a desired level regardless of the degree of distortion during said distortion step, said maintaining step being performed in response to a selected distortion level input from a user.

38. A circuit for processing an audio signal comprising:

only one user input device for receiving user input specifying distortion level;

a distortion element, responsive to said user input device, for providing a distorted audio signal having said distortion level specified, and having a gain which varies in a known way corresponding with said distortion level; and and output element, responsive to said user input device, for providing said distorted audio signal amplified or attenuated by a gain corresponding with said distortion element and output element is fixed for all distortion levels.

39. A circuit as claimed in claim 38, further comprising:

a compressor, responsive to said user input device, for compressing said audio signal prior to said distortion element, and having a release time of said compression, said release time corresponding with said distortion level specified such that said release time is lower at higher distortion levels.

40. A circuit as claimed in claim 38, further comprising:

a prefilter, responsive to said user input device, for filtering said audio signal prior to said distortion element having settings to at least partially compensate for spectral and harmonic variations caused by said distortion element, and operating over at least upper, middle and lower bands, said settings corresponding with said distortion level specified, such that said upper and lower bands are emphasized less at higher distortion levels relative to said middle band.

41. A circuit as claimed in claim 38 further comprising:

an equalizer, responsive to said user input device, for filtering said audio signal after said distortion element, reducing spectral and harmonic variations caused by said distortion element, and operating over at least upper, middle and lower bands said reduction of spectral and harmonic variations corresponding with said distortion level specified such that said upper and lower bands are emphasized less at higher distortion levels relative to said middle band.

42. A circuit for processing an audio signal comprising:

means for distorting said audio signal;

means for indicating a desired degree of distortion including only a single input device;

means responsive to said indicating means for controlling the degree of distortion caused by said distortion means, said distortion means having an output volume which varies in a predetermined way as the degree of distortion increases; and output means responsive to said single input device for automatically maintaining the volume of the audio signal output from said circuit substantially at a desired level regardless of the degree of distortion caused by said distortion means.

43. A circuit as claimed in claim 42 wherein said distortion means includes only a predetermined number of distortion states, each providing a different degree of distortion; and wherein said output means includes only a predetermined number of fixed gain elements, each one of said elements corresponding to one of said distortion states and having a gain value which causes the overall gain of the distortion means and output means, combined, to remain substantially constant for each of said states.

44. A circuit for processing an audio signal comprising:

a user input device for receiving user input specifying distortion level;

a distortion element, responsive to said user input device, for providing a distorted audio signal having said distortion level specified, and having a gain which varies in a known way corresponding with said distortion level; and and output element, responsive to said user input device, for providing said distorted audio signal amplified or attenuated by a gain corresponding with said distortion level specified, such that a total gain through said distortion element and output element is fixed for all distortion levels.

* * * * *